(12) United States Patent
Govindarajulu et al.

(10) Patent No.: US 7,940,091 B1
(45) Date of Patent: May 10, 2011

(54) BOOTSTRAPPED SWITCH FOR SAMPLING VOLTAGES BEYOND THE SUPPLY VOLTAGE

(75) Inventors: Srikanth Govindarajulu, Colorado Springs, CO (US); Andrew Joseph Gardner, Boulder, CO (US); Robert C. Chiacchia, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 12/396,151

(22) Filed: Mar. 2, 2009

(51) Int. Cl.
*H03K 5/00* (2006.01)
(52) U.S. Cl. ............................. 327/91; 327/94; 327/390
(58) Field of Classification Search .................... 327/91, 327/94, 390
See application file for complete search history.

(56) References Cited

U.S. PATENT DOCUMENTS

| | | | |
|---|---|---|---|
| 5,945,872 A | | 8/1999 | Robertson et al. |
| 6,060,937 A | | 5/2000 | Singer et al. |
| 6,118,326 A | * | 9/2000 | Singer et al. .................. 327/390 |
| 6,249,154 B1 | * | 6/2001 | Jouffre et al. .................. 327/91 |
| 6,323,697 B1 | * | 11/2001 | Pavan ............................ 327/94 |
| 6,518,901 B2 | * | 2/2003 | Pinna et al. .................... 341/122 |
| 6,977,544 B2 | * | 12/2005 | Nicollini et al. ............... 327/589 |
| 7,015,729 B1 | * | 3/2006 | Tursi et al. ...................... 327/94 |
| 7,034,736 B1 | * | 4/2006 | Ali ................................ 341/162 |
| 7,183,814 B2 | * | 2/2007 | Kudo ............................. 327/91 |
| 7,274,222 B2 | * | 9/2007 | Alacoque et al. ............... 327/94 |
| 7,453,291 B2 | * | 11/2008 | Song .............................. 327/91 |
| 7,479,811 B2 | * | 1/2009 | Chou et al. ..................... 327/94 |

* cited by examiner

*Primary Examiner* — Kenneth B. Wells
(74) *Attorney, Agent, or Firm* — McDermott Will & Emery LLP

(57) ABSTRACT

Methods and apparatus for sampling an input voltage and apparatus incorporating the same are disclosed. An input voltage sampling apparatus includes a voltage sampling circuit coupled to the input voltage and configured to produce a sampled input voltage at an output terminal, and a voltage charging circuit coupled to the voltage sampling device and producing a first charged voltage on a first charged voltage output terminal and a second charged voltage on a second charged voltage output terminal. A voltage charging enabling circuit is coupled to the voltage charging circuit, the voltage sampling device via the first connection, and a power supply voltage. Further, the input voltage sampling apparatus includes a control circuit coupled to the voltage sampling circuit, the voltage charging circuit, and the power supply voltage, ground, third and fourth pulse signals. The first and third pulse signals are non-overlapping with the second and fourth pulse signals. The first pulse signal is delayed on the rising edge of the third pulse signal and the second pulse signal is delayed on the rising edge of the fourth pulse signal. The voltage sampling apparatus is capable of sampling an input voltage that is higher than the power supply voltage.

19 Claims, 3 Drawing Sheets

BOOTSTRAPPED SWITCH FOR SAMPLING VOLTAGES BEYOND THE SUPPLY VOLTAGE

BACKGROUND

1. Technical Field

The present teaching relates generally to methods and systems for analog circuits. More specifically, the present teaching relates to methods and systems for sampling an input voltage and systems incorporating the same.

2. Discussion of Technical Background

Voltage sampling is a frequently used technology. One challenge is to sample an input voltage reliably, accurately and consistently. Various attempts have been made to provide designs to achieve that. There exist a number of prior art designs aimed at providing a circuit that can reliably sample an input voltage. One such circuit is described in U.S. Pat. No. 5,945,872 to Robertson. There are subsequent improvements made to the original Robertson circuit. See U.S. Pat. No. 6,060,937 and U.S. Pat. No. 6,118,326 to Singer et al. These prior art patents disclose circuits that aim at producing an improved MOS FET switch that operates on only two clock phases and enabling higher speed operation. There are various drawbacks of these prior art circuits. For example, these circuits can not accurately sample input voltages that are above the supply voltage (V++) at which the circuit operates. The reason is that they suffer from the body diode (n-well to p+) from the external pin to the on-chip circuitry. In fact, the presence of such diode prevents all of the previous attempts from sampling any voltage that is higher than the supply voltage (V++), which is used to bias the n-well (cathode) of the body diode.

Therefore, there is a need for a circuit that is capable of sampling any input voltage reliably and precisely. This includes sampling a voltage that is higher than the supply voltage. In addition, there is a need for a circuit that can sample any input voltage, including a voltage higher than the supply voltage, using a sampling device that has a constant switch-on resistance on the sampling device.

SUMMARY OF THE PRESENT TEACHING

The present teaching relates to methods and apparatus for sampling any input voltage, including an input voltage higher than a supply voltage based on which the apparatus operates, as well as systems incorporating the same.

According to one embodiment of the present teaching, an apparatus for sampling an input voltage, capable of sampling an input voltage higher than a power supply voltage based on which the apparatus operates, comprises a voltage sampling circuit coupled to the input voltage and configured to produce a sampled input voltage at an output terminal, a voltage charging circuit coupled to the voltage sampling device via a first connection, a power supply, and a first and second pulse signals, producing a first charged voltage on a first charged voltage output terminal and a second charged voltage on a second voltage output terminal, and a control circuit coupled to the voltage sampling circuit, the first voltage charging circuit, the power supply voltage, ground, third and fourth pulse signals.

In such an embodiment, the first and third pulse signals are non-overlapping with the second and fourth pulse signals. The first pulse signal is delayed on the rising edge of the third pulse signal. The second pulse signal is delayed on the rising edge of the fourth pulse signal.

In accordance with another embodiment of the present teaching, an apparatus incorporating a voltage sampling device comprises an input voltage terminal receiving an input voltage provided to the apparatus, an input voltage sampling device configured for sampling the input voltage to produce a sampled input voltage, and a circuitry configured to receive the sampled input voltage, wherein the input voltage sampling device is configured to sample any input voltage, including an input voltage that is higher than a power supply voltage based on which the input voltage sampling voltage operate.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

The present teaching relates to bootstrapped voltage sampling. Specifically, the present teaching discloses bootstrap voltage sampling methods and systems that are capable of sampling any input voltage including those that are higher than a supply voltage at which the underlying circuit operates. In addition, the present teaching discloses bootstrap voltage sampling methods and systems that are capable of sampling any input voltage, including those higher than the supply voltage, with a minimum sampling distortion by maintaining a substantially constant switch-on resistance with respect to the sampling device.

Figure 1:
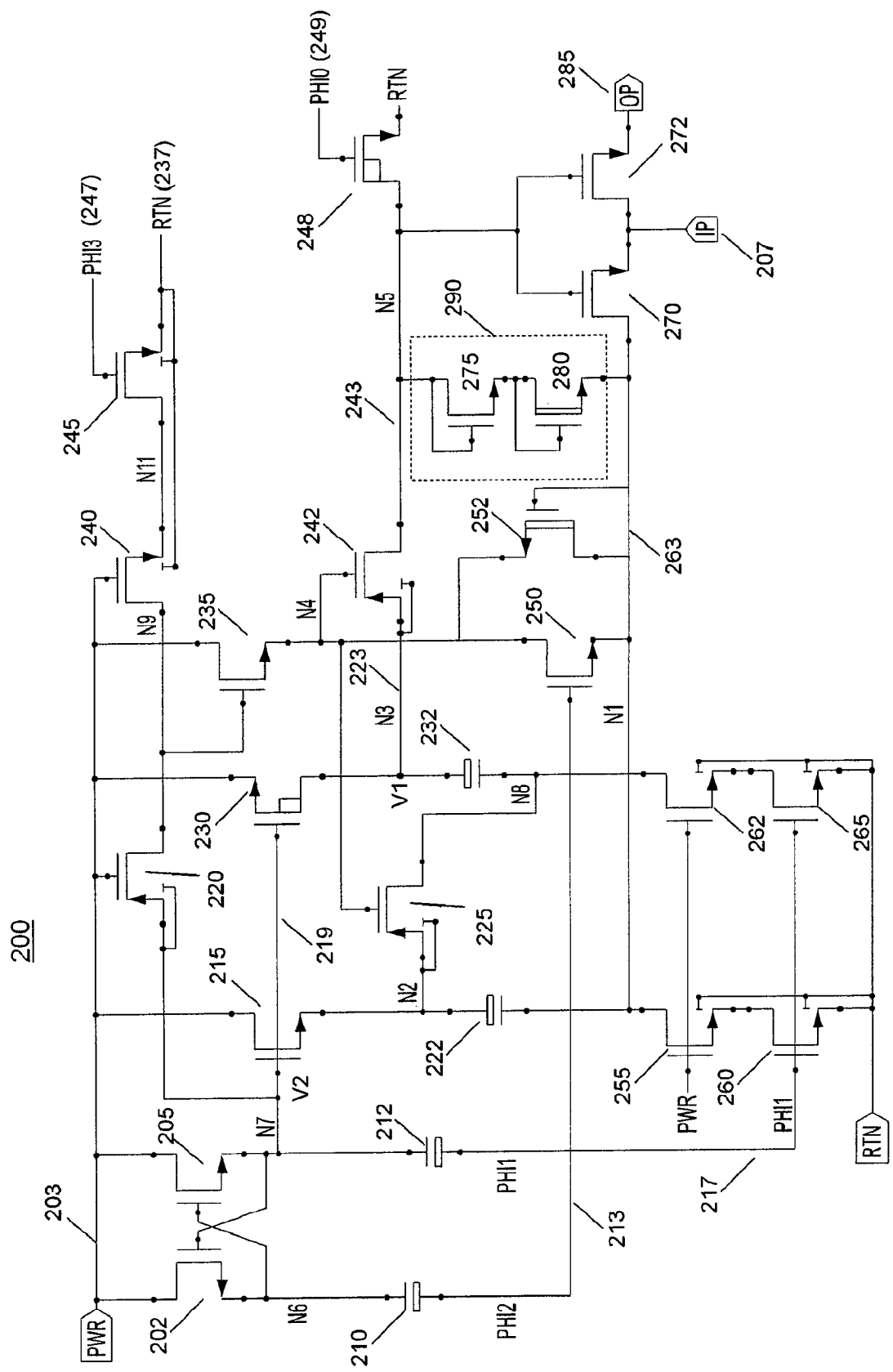
FIG. 1 depicts an exemplary design for a voltage sampling circuit capable of sampling an input voltage higher than a supply voltage, according to an embodiment of the present teaching.

FIG. 1 depicts an exemplary design for a bootstrapped voltage sampling circuit 200 capable of sampling any input voltage including those higher than a supply voltage to the circuit, according to an embodiment of the present teaching. In the illustrated embodiment, the bootstrapped voltage sampling circuit 200 includes a voltage sampling circuit comprising NMOS transistors 270 and 272, a first voltage charging circuit comprising capacitors 222 and 232 and PMOS transistor 225, a second voltage charging circuit comprising NMOS transistors 202 and 205 as well as capacitors 210 and 212, a voltage charging enabling circuit comprising NMOS transistors 255, 260, 262, and 265, and a control circuit comprising 10 transistors (220, 235, 240, 245, 215, 230, 242, 250, 252, and 248). The exemplary embodiment further includes an optional stack of transistors serving as a diode stack that can be used to explicitly limit the gate-to-source voltage to a constant value, thereby preventing the breakdown of the NMOS sampling transistors 272 and 270. This diode stack is seen in FIG. 1 as the dotted box 290 with two NMOS transistors 275 and 280 as an illustration.

In the illustrated embodiment, the voltage sampling circuit includes two NMOS sampling transistors 270 and 272. As shown, the source terminal of transistor 270 is coupled to the drain terminal of transistor 272. To sample an input voltage, the voltage sampling circuit both takes an input voltage as input and produces an output voltage as sampled voltage. This is seen in the circuit that an input voltage is provided via, e.g., an input pin (IP) 207 connected to the drain and source terminals of the two NMOS sampling transistors and, in addition, an output voltage or sampled voltage 285 is produced at the source terminal of transistor 272. The drain terminal of transistor 270 is coupled to N1 263, which is also connected to other parts of the circuit 200. The gate terminals of transistor 270 and 272 are coupled together and coupled to N5 243, which is also connected to other parts of the circuit 200.

In the illustrated embodiment, the first voltage charging circuit (capacitors 222 and 232 and PMOS transistor 225) is to produce a charged voltage V1 at node N3 (223). Transistor 225 is connected in-between capacitors 222 and 232 so that when transistor is turned on, capacitors 222 and 225 are substantially serially connected. The conditions under which transistor 225 is turned on is discussed below. The first voltage charging circuit is coupled to the voltage charging enabling circuit comprising transistors NMOS 255, 260, 262, and 265. Transistors 255 and 260 are serially connected. The gate terminal of transistor 255 is connected to a power supply voltage (PWR). The source terminal of transistor 255 is connected to the drain terminal of transistor 260. The source terminal of transistor 260 is connected to the ground, as illustrated. The gate terminal of transistor 260 is connected to a pulse signal PHI1 (217).

The gate terminal of transistor 262 is connected to the gate terminal of transistor 255 (to the PWR). The gate terminal of transistor 265 is connected to the gate terminal of transistor 260 (to PHI1 217). The source terminal of transistor 262 is connected to the drain terminal of transistor 265, whose source terminal is connected to the ground. That is, while transistors 255 and 260 form a series and transistors 262 and 265 form another series, the two series are in parallel. That is, whenever series transistors 255 and 260 are turned on, series transistors 262 and 265 are also turned on. Since the gate terminals of transistors 255 and 262 are connected to power supply PWR, the series is turned on in accordance with the pulse signal PHI1 217. When the two series are turned on, the voltages at the source terminals of transistors 255 and 262 are provided to one terminal of capacitors 222 and 232. This will be discussed below.

In the illustrated embodiment, the second voltage charging circuit, comprising NMOS transistors 202 and 205 as well as capacitors 210 and 212, provides a charged voltage V2 at node N7 (219). The second voltage charging circuit is a voltage doubler. In this second voltage charging circuit, transistors 202 and 205 are cross connected, i.e., the gate terminal of transistor 202 is connected to the source terminal of transistor 205 and vice versa. The drain terminals of both transistors 202 and 205 are connected to the supply voltage PWR (203). The source terminal of transistor 202 is connected to one terminal of capacitor 210. The other terminal of capacitor 210 is connected to a pulse signal PHI2 213. Similarly, the source terminal of transistor 205 is connected to one terminal of capacitor 212. The other terminal of capacitor 212 is connected to the gate terminal of transistor 260 in the voltage charging enabling circuit and together it is coupled to pulse signal PHI1 217. The relationship between PHI1 217 and PHI2 213 will be discussed herein with reference to FIG. 3.

As illustrated in the exemplary embodiment 200, the control circuit of the voltage sampling circuit 200 includes about 10 transistors. For the ease of presentation, they are divided into different sub-control circuits. Specifically, the control circuit comprises seven control sub-circuits, including a first control sub-circuit comprising NMOS transistor 248, a second control sub-circuit comprising PMOS transistor 242, a third control sub-circuit comprising PMOS transistor 220, NMOS transistors 235, 240, and 245, a fourth control sub-circuit comprising NMOS transistor 215, a fifth control sub-circuit comprising NMOS transistor 230, a sixth control sub-circuit comprising NMOS transistor 250, and a seventh control sub-circuit comprising NMOS transistor 252.

In the exemplary embodiment as shown in FIG. 1, the first control sub-circuit (transistor 248) controls the turn-on and turn-off of the voltage sampling circuit (270, 272). The gate terminal of transistor 248 is connected to a pulse signal PHI0 249, the source terminal to the ground, and the drain terminal connected to a node N5 (243), which is connected to the voltage sampling circuit, as discussed herein. As shown in the exemplary embodiment, transistor 248 is shown as an asymmetric device. In some embodiments, this device may also be implemented using two serially connected symmetric devices. For example, transistor 248 may be a symmetric transistor (rather than an asymmetric device as shown in FIG. 1) having its drain terminal connected to the source terminal of another transistor (not shown), whose drain terminal is then connected to node N5 243. The gate terminal of this added cascode transistor would then be tied to the power supply PWR.

The second control sub-circuit includes transistor 242, which is implemented using a PMOS transistor in the exemplary embodiment in FIG. 1. The drain terminal of transistor 242 is connected to node N5 243 and the source terminal of transistor 242 is connected to node N3 223, which is the output node N3 (223) of the first voltage charging circuit, as discussed above. The gate terminal of transistor 242 is coupled to the third control sub-circuit, specifically to the source terminal of transistor 235. Transistors 240 and 245 of the third control sub-circuit are connected serially. Specifically, the source terminal of transistor 245 is connected to the ground, the gate terminal of transistor 245 is connected to pulse signal PHI3 (247), and the drain terminal of transistor 245 is connected to the source terminal of transistor 240 on a node N11. The gate terminal of transistor 240 is coupled to the supply voltage PWR 203. The drain terminal of transistor 240 is connected to the drain terminal of transistor 220 and the gate terminal of transistor 235 on node N9. The gate terminal of transistor 220 is also connected to the supply voltage PWR. The source terminal of transistor 220 is coupled to node N7 (219), which is a node on which the charged voltage V2 is produced by the second voltage charging circuit (202, 205, 210, 212).

In this exemplary embodiment, transistors 240 and 245 are serially connected. In an alternative embodiment, one can use a single asymmetric transistor (not shown) to replace the serially connected transistors. In that case, the source terminal of the single asymmetric device is connected to the ground, the gate terminal is connected to the pulse signal PHI3, and the drain terminal of the single asymmetric device is connected to node N9 and coupled with the drain terminal of transistor 220.

The fourth control sub-circuit includes an NMOS transistor 215, whose gate terminal is connected to the N7 node (219) on which the charged voltage V2 is provided, source terminal connected to the source of transistor 225 in the first voltage charging circuit, and drain terminal connected to the supply voltage PWR (203). The fifth control sub-circuit is implemented using an asymmetric transistor or NMOS transistor 230. The source terminal of this asymmetric device is connected to the supply voltage, the gate terminal is connected to node N7 and coupled with the gate node terminal of transistor 215, and drain terminal of transistor 230 is connected to node N3 on which the charged voltage V1 is provided.

The sixth control sub-circuit is implemented based on an NMOS transistor 250 and the seventh control sub-circuit is implemented based on an NMOS transistor 252. The sixth and seventh control sub-circuits are coupled to each other. Specifically, the source terminal of transistor 250 and the drain terminal of transistor 252 are coupled together and connect to node N1 263. In addition, the drain terminal of transistor 250 and the source terminal of transistor 252 are coupled together and connect to the gate terminals of transistors 242 and 225 and the source terminal of transistor 235.

Figure 2:
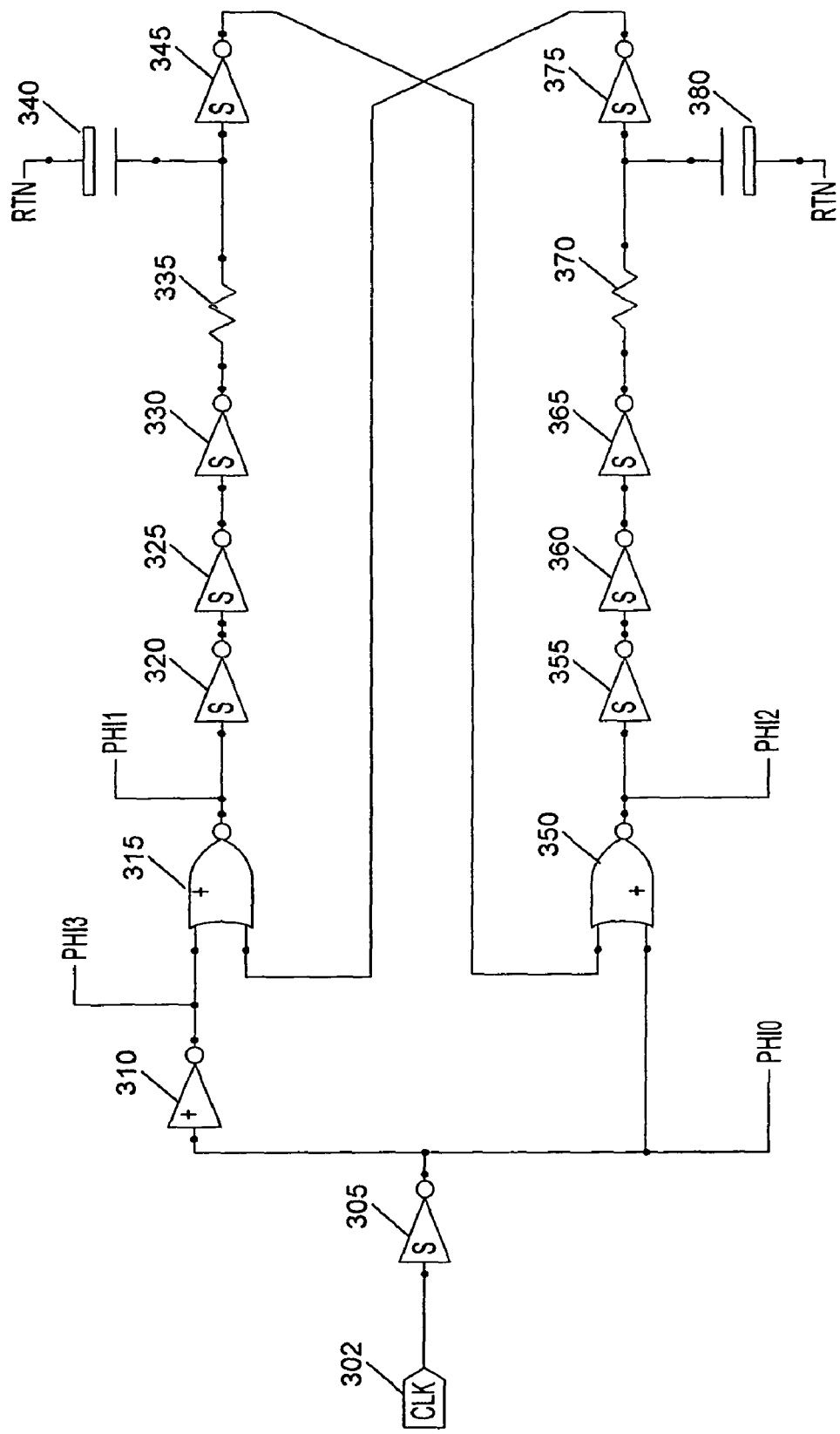
FIG. 2 depicts an exemplary circuit for generating various pulse signals.
Figure 3:
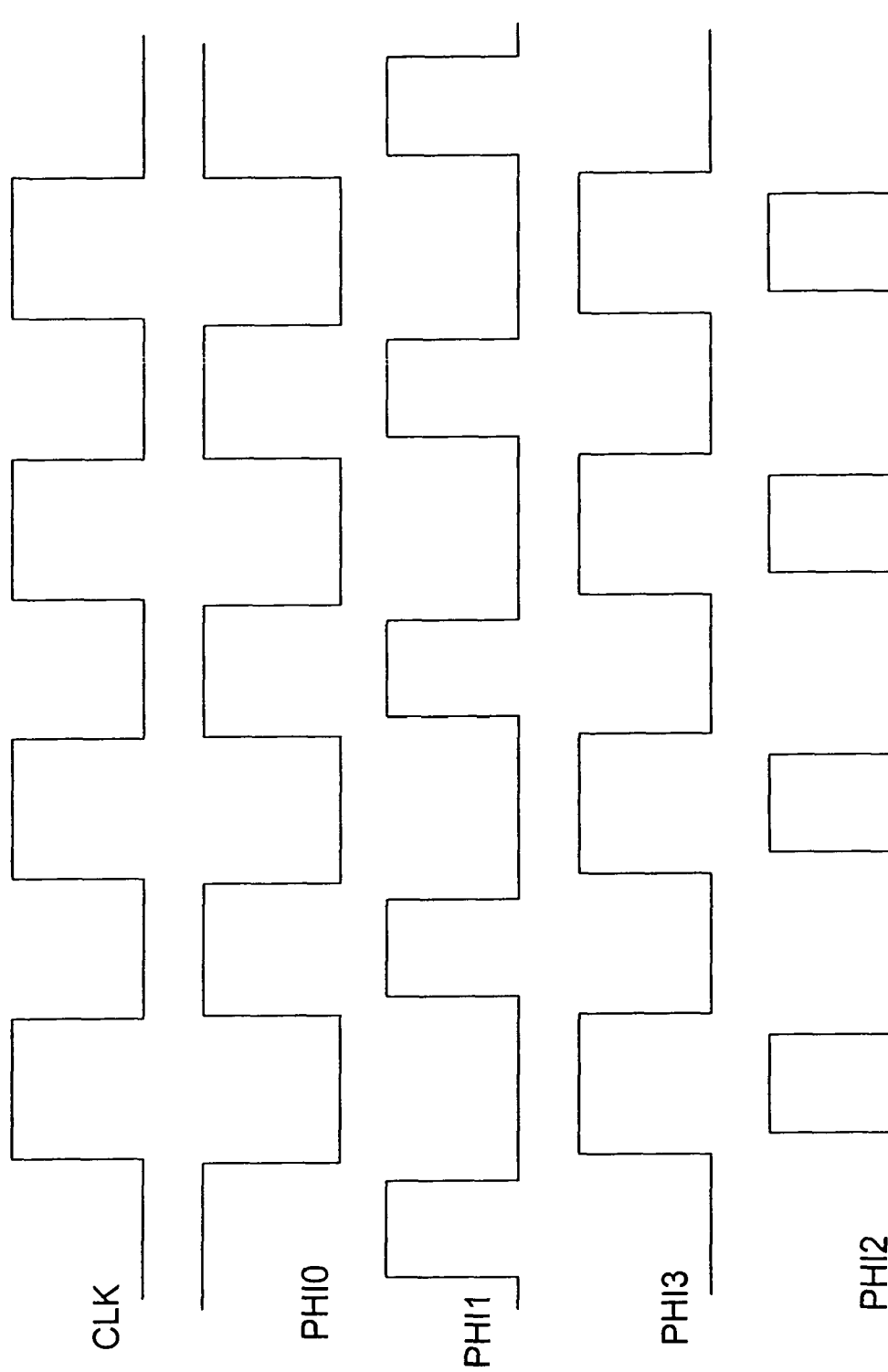
FIG. 3 illustrates different pulse signals and their temporal relationship.

In the exemplary voltage sampling circuit 200, different pulse signals are used (PHI0, PHI1, PHI2, and PHI3). They are used to control the timing of different operations and they, with respect to each other, have different temporal relationships. FIG. 2 depicts an exemplary circuit 300 for generating these pulse signals. As can be seen, pulse signal PHI0 is the output of an inverse gate 305 generated based on a clock signal 302. Pulse signal PHI3 is an inverse signal of PHI0 via an inverse gate 310. Pulse signal PHI1 is a delayed signal of PHI0, derived via a series of gates and components 350, 355, 360, 365, 375, and 315. Similarly, pulse signal PHI2 is a delayed signal of PHI3, derived via a series gates and components 315, 320, 325, 330, 335, 345, and 350. In FIG. 3, the temporal non-overlapping relationship between clock signal 302, PHI1, and PHI2 are shown. The delayed relationships between PHI0 and PHI1 as well as between PHI2 and PHI3 are not shown.

Below, the operation of the bootstrap voltage sampling circuit 200 is described. The operation is conducted based on a two-phase non-overlapping pulse signals PHI1 and PHI2, which are generated using the circuit as illustrated in FIG. 2. The input voltage to the circuit is 207, an input to the voltage sampling circuit comprising transistors 270 and 272. The voltage sampled 285 is at the source terminal of transistor. When PHI0 is high, transistor 248 is turned on so that the source terminal of transistor 248 is pulled to low close to the ground. This turns off both transistors 270 and 272 and no voltage sampling is performed.

As discussed above, PHI0 and PHI1 pulse signals are in-phase clocks. When PHI0 and PHI1 are asserted, the second voltage charging circuit (202, 205, 210, 212) charges node N7 to a voltage of 2*PWR due to its function as a voltage doubler This happens because during the earlier phase when PHI0 and PHI1 are de-asserted, i.e., when PHI2 and PHI3 are asserted, node N7 has been charged to PWR via the NMOS transistor 205. Hence the nodes N7 and N6 are charged to PWR and 2*PWR alternatively. Due to PHI1 being high, it turns on transistors 260, 255, and 215 and enables capacitor 222 to be charged to PWR. Similarly, when PHI1 is high, this turns on transistors 265, 262, and 230 and enables capacitor 232 to be also charged to the voltage level of PWR. Due to the high voltage at node N7 (2*PWR), it turns on transistor 220 and 235, whose gate terminal is pumped to 2*PWR. When transistor 235 is on, it turns off the PMOS transistors 225 and 242. At the same time, since PHI2 and PHI3 are low during PHI1 phase, transistors 250, and 245 are turned off. Therefore, the turn-off operation of transistor 242 is achieved by a combination of transistors 240, 245, 248, 230, and 235 and, therefore, there is no limiting body diode between the input voltage (207) and the supply voltage (PWR).

When PHI2 is high, node N7 is charged to the voltage level of PWR. This happens because when PHI2 is high node N6 gets charged to 2*PWR, thereby turning-on transistor 205 and turning-off transistor 202. Hence capacitor 212 and node the N7 gets charged to PWR, when PHI1 is low and PHI2 is high. This also turns off transistors 215, 230, as well as 220. When PHI3 and PHI2 are high, transistors 245 and 250 are turned on. As the transistor 220 is now turned off, transistors 245 and 240 pull the voltage on node N9 to low close to the ground. This turns off transistor 235. In addition, due to a low voltage on PHI1, transistors 260 and 265 are turned off. Due to a high PHI2 voltage, transistor 250 is turned on. This enables transistors 225 and 242 being turned on, which allows the initial charged voltage of 2*PWR being passed onto node N5 243. The voltage of 2*PWR on node N5 turns on transistors 270 and 272, which enables the input voltage 207 being sampled on capacitors 222 and 232.

Node N5 (243) eventually attains a voltage level of (input voltage+2*PWR). This allows the gate to source voltage across voltage sampling switch 272 and also across transistor 270 to be kept at a constant value of 2*PWR for the entire range of the input voltage. Although in reality, due to the presence of parasitics, node N5 (243) may be charged to a level slightly lower than the theoretical constant of (input voltage+2*PWR), e.g., (input voltage+1.6*PWR). However, it is a constant value and therefore, the variation of the switch-on resistance of transistor 272 for the input voltage range (usually 0 to 6V) is kept at minimum. The only impact is from variation of threshold voltage of transistor 272 due to the change in body effect with changing input voltage from, e.g., 0V to 6V in a typical CMOS process.

Transistor 252 is used to limit the gate to source voltage of 242 within a tolerable limit allowed by the process, whenever the input voltage is more than the supply voltage PWR. The optional stack of diodes (290) may be used to limit the gate to source voltage across the voltage sampling switch or transistor 272 and also transistor 270 to a constant value other than (2*PWR).

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

We claim:

1. An apparatus for sampling an input voltage, comprising:
   a voltage sampling circuit coupled to receive the input voltage up to or greater than a supply voltage and configured to produce a sampled input voltage at an output terminal;
   a voltage charging circuit coupled to the voltage sampling circuit via a first connection, to a power supply voltage, and to first and second pulse signals, producing a first charged voltage at a first charged voltage output terminal and a second charged voltage at a second charged voltage output terminal; and
   a control circuit coupled to the voltage sampling circuit, to the voltage charging circuit, and configured to receive the power supply voltage, ground, and third and fourth pulse signals, wherein
   the first and third pulse signals are non-overlapping with the second and fourth pulse signals, respectively,
   each high pulse of the first pulse signal is within a corresponding high pulse of the third pulse signal, with a rising edge of the high pulse of the first pulse signal delayed with respect to that of the high pulse of the third pulse signal and a falling edge of the high pulse of the third pulse signal delayed with respect to that of the high pulse of the first pulse signal, each high pulse of the second pulse is within a corresponding high pulse of the fourth pulse signal, with a rising edge of the high pulse of the second signal is delayed with respect to that of the high pulse of the fourth pulse signal and a falling edge of the high pulse of the fourth pulse signal delayed with respect to that of the high pulse of the second pulse signal;

wherein the voltage charging circuit comprises:

a first voltage charging circuit coupled to the voltage sampling device via the first connection and producing the first charged voltage at the first charged voltage output terminal;

a second voltage charging circuit coupled to the power supply and the first and second pulse signals, and producing the second charged voltage at the second charged voltage output terminal; and a voltage charging enabling circuit coupled to the first voltage charging circuit and the second voltage charging circuit, the voltage sampling device via the first connection, and to receive the power supply voltage.

2. The apparatus according to claim 1, further comprising a diode stack including a plurality of serially connected transistors, having the drain of a first of the transistors connecting to the second connection, the source of each of the transistors connected to drain terminal of an adjacent transistor in the series, and the source of a last of the transistors connecting to the first connection, and the gate of each of the transistors connecting to the drain of the same transistor.

3. An apparatus for sampling an input voltage, comprising:

a voltage sampling circuit coupled to receive the input voltage up to or greater than a supply voltage and configured to produce a sampled input voltage at an output terminal;

a voltage charging circuit coupled to the voltage sampling circuit via a first connection, to a power supply voltage, and to first and second pulse signals, producing a first charged voltage at a first charged voltage output terminal and a second charged voltage at a second charged voltage output terminal; and a control circuit coupled to the voltage sampling circuit, to the voltage charging circuit, and configured to receive the power supply voltage, ground, and third and fourth pulse signals, wherein the first and third pulse signals are non-overlapping with the second and fourth pulse signals, respectively, each high pulse of the first pulse signal is within a corresponding high pulse of the third pulse signal, with a rising edge of the high pulse of the first pulse signal is delayed with respect to that of the high pulse of the third pulse signal and a falling edge of the high pulse of the third pulse signal delayed with respect to that of the high pulse of the first pulse signal, each high pulse of the second pulse is within a corresponding high pulse of the fourth pulse signal, with a rising edge of the high pulse of the second signal delayed with respect to that of the high pulse of the fourth pulse signal and a falling edge of the high pulse of the fourth pulse signal delayed with respect to that of the high pulse of the second pulse signal;

wherein the voltage charging circuit comprises:

a first voltage charging circuit coupled to the voltage sampling device via the first connection and producing the first charged voltage at the first charged voltage output terminal;

a second voltage charging circuit coupled to the power supply and the first and second pulse signals, and producing the second charged voltage at the second charged voltage output terminal; and a voltage charging enabling circuit coupled to the first voltage charging circuit and the second voltage charging circuit, the voltage sampling device via the first connection, and to receive the power supply voltage; and wherein the voltage sampling circuit comprises first and second transistors having gates coupled together to connect to a second connection, the drain of the source transistor serving as the output terminal, the drain of the first transistor connected to the source of the second transistor and together coupled to the input voltage, and drain of the second transistor connected to the first connection.

4. The apparatus according to claim 3, wherein the first voltage charging circuit comprises:

a third transistor having a gate coupled to the control circuit;

a first capacitor having one terminal connected to the source of the third transistor and together coupled to the control circuit and another terminal connected to the first voltage charging enabling circuit; and a second capacitor having one terminal connected to the drain of the third transistor and another terminal coupled to the first charged voltage output terminal.

5. The apparatus according to claim 4, wherein the second voltage charging circuit comprises:

fourth and fifth transistors having drain terminals connected to the power supply voltage, the gate of the fourth transistor connected to the source of the fifth transistor and together connecting to the second charged voltage output terminal, and the gate of the fifth transistor connected to the source of the fourth transistor;

a third capacitor having one terminal connected to the source of the fourth transistor and another terminal connected to the second pulse signal; and a fourth capacitor having one terminal connected to the source of the fifth transistor and another terminal connected to the first pulse signal.

6. The apparatus according to claim 5, wherein the voltage charging enabling circuit comprises:

serially connected sixth and seventh transistors having the source terminal of the seventh transistor connected with the drain of the sixth transistor, the source of the sixth transistor coupled to the ground, and the drain of the seventh transistor coupled to the another terminal of the second capacitor of the first voltage charging circuit; and serially connected eighth and ninth transistors having the source of the ninth transistor connected with the drain of the eighth transistor, the source of the eighth transistor coupled to the ground, and drain of the ninth transistor coupled to the another terminal of the first capacitor of the first voltage charging circuit, wherein gates of the sixth and eighth transistors are connected and coupled to the first pulse signal, gates of the seventh and ninth transistors are connected and coupled to the power supply voltage, and the source of the ninth transistor is coupled to the voltage sampling circuit via the first connection.

7. The apparatus according to claim 6, wherein the control circuit comprises:

a first control circuit coupled to the voltage sampling circuit via the second connection, the first pulse signal, and the ground;

a second control circuit coupled to the voltage sampling circuit and the first control circuit via the second connection;

a third control circuit coupled to the fourth pulse signal, the ground, the second charged voltage output terminal, and the second control circuit;

a fourth control circuit coupled to the second charged voltage output terminal, the power supply voltage, and the first voltage charging circuit;

a fifth control circuit coupled to the fourth control circuit, to the first voltage charging circuit, and to receive the power supply voltage;

a sixth control circuit coupled to the second pulse signal, the first connection, and the first voltage charging circuit, the second and third control circuits; and a seventh control circuit coupled to the first connection and the sixth control circuit.

8. The apparatus according to claim 7, wherein the first control circuit includes an asymmetric device having a first terminal connected to the first pulse signal, a second terminal connected to the ground, and a third terminal connected to the first connection.

9. The apparatus according to claim 7, wherein the first control circuit comprises a pair of serially connected tenth and eleventh transistors having the gate of the tenth transistor connected to the first pulse signal, the source of the tenth transistor connected to the ground, the drain of the tenth transistor connected to the source of the eleventh transistor, the drain of the eleventh transistor connected to the second connection and the gate of the eleventh transistor connected to receive the power supply voltage.

10. The apparatus according to claim 9, wherein the second control circuit includes a twelfth transistor having its drain coupled to the voltage sampling circuit via the second connection, source terminal connected to the first charged voltage output terminal, and gate terminal coupled to the gate terminal of the third transistor of the first voltage charging circuit.

11. The apparatus according to claim 10, wherein the third control circuit comprises:

thirteenth and fourteenth serially connected transistors, wherein the gate of the thirteenth transistor is coupled to the fourth pulse signal, the source of the thirteenth transistor is coupled to the ground, the drain of the thirteenth transistor is connected to the source of the fourteenth transistor, the gate of the fourteenth transistor is connected to receive the power supply voltage;

a fifteenth transistor having its gate connected to receive the power supply voltage, its drain connected to the drain of the fourteenth transistor, and its source connected to the second charged voltage output terminal; and a sixteenth transistor having its gate coupled to the source of the fourteenth transistor, its drain connected to receive the power supply voltage, and its source coupled with the second, sixth, and seventh control circuits.

12. The apparatus according to claim 11, wherein the fourth control circuit includes a seventeenth transistor having its gate connected to the second charged voltage output terminal, its source connected to the drain of the third transistor of the first voltage charging circuit, and its drain connected to receive the power supply voltage.

13. The apparatus according to claim 12, wherein the fifth control circuit includes an eighteenth transistor having the gate connected to the second charged voltage output terminal, the drain connected to receive the power supply voltage, and the source terminal connected to the first charged voltage output terminal.

14. The apparatus according to claim 13, wherein the fifth control circuit comprises serially connected nineteenth and twentieth transistors having the drain of the nineteenth transistor connected with the source of the twentieth transistor, the source of the nineteenth transistor connected to receive the power supply voltage, and the drain of the twentieth transistor connected to the first charged voltage output terminal, and the gate terminal of the nineteenth transistor connected to the second charged voltage output terminal and the gate terminal of the twentieth transistor connected to receive the power supply voltage.

15. The apparatus according to claim 14, wherein the sixth control circuit includes a twenty first transistor having its gate connected to the second pulse signal, its source connected to the first connection, and its drain coupled to the gate of the third transistor of the first voltage charging circuit.

16. The apparatus according to claim 15, wherein the seventh control circuit includes a twenty second transistor having its gate and drain connected to the first connection and its source connected to the gate of the third transistor of the first voltage charging circuit.

17. An apparatus, comprising:

an input voltage terminal for receiving an input voltage provided to the apparatus;

an input voltage sampling device configured for sampling the input voltage to produce a sampled input voltage; and circuitry configured to receive the sampled input voltage, wherein the input voltage sampling device is configured to sample any input voltage, including an input voltage that is higher than a power supply voltage based on which the input voltage sampling voltage operates, and the input voltage sampling device is controlled by first, second, third, and fourth pulse signals, where the first and third pulse signals are non-overlapping with the second and fourth pulse signals respectively, each high pulse of the first pulse signal is within a corresponding high pulse of the third pulse signal, with a rising edge of the high pulse of the first pulse signal delayed with respect to that of the high pulse of the third pulse signal and a falling edge of the high pulse of the third pulse signal delayed with respect to that of the high pulse of the first pulse signal, each high pulse of the second pulse is within a corresponding high pulse of the fourth pulse signal, with a rising edge of the high pulse of the second signal delayed with respect to that of the high pulse of the fourth pulse signal and a falling edge of the high pulse of the fourth pulse signal delayed with respect to that of the high pulse of the second pulse signal, wherein the input voltage sampling device comprises:

a voltage sampling circuit coupled to the input voltage and configured to produce the sampled input voltage at an output terminal;

a first voltage charging circuit coupled to the voltage sampling device via a first connection and producing a first charged voltage at a first charged voltage output terminal;

a second voltage charging circuit coupled to a power supply voltage and first and second pulse signals, and producing a second charged voltage at a second charged voltage output terminal;

a voltage charging enabling circuit coupled to the first voltage charging circuit and the second voltage charging circuit, the voltage sampling device via the first connection, and to receive the power voltage supply; and a control circuit coupled to the voltage sampling circuit, the first and second voltage charging circuits, and the voltage charging enabling circuit, and to receive the power supply voltage, ground, third and fourth pulse signals, wherein the first and third pulse signals are non-overlapping with the second and fourth pulse signals, the first pulse signal is delayed on the rising edge of the third pulse signal, and the second pulse signal is delayed on the rising edge of the fourth pulse signal.

18. The apparatus according to claim 17, wherein the control circuit comprises:

a first control circuit coupled to the voltage sampling circuit via a second connection, the first pulse signal, and the ground;

a second control circuit coupled to the voltage sampling circuit and the first control circuit via the second connection;

a third control circuit coupled to the fourth pulse signal, the ground, the second charged voltage output terminal, and the second control circuit;

a fourth control circuit coupled to the second charged voltage output terminal, the power supply voltage, and the first voltage charging circuit;

a fifth control circuit coupled to the fourth control circuit, the first voltage charging circuit, and the power supply voltage;

a sixth control circuit coupled to the second pulse signal, the first connection, and the first voltage charging circuit, the second and third control circuits; and a seventh control circuit coupled to the first connection and the sixth control circuit.

19. The apparatus according to claim 17, wherein the control circuit is configured to control the input voltage sampling device in accordance with a dual-phase pulse signal.

* * * * *